United States Patent
Kim et al.

(10) Patent No.: US 11,231,736 B2
(45) Date of Patent: Jan. 25, 2022

(54) REFERENCE VOLTAGE GENERATING CIRCUIT METHOD OF GENERATING REFERENCE VOLTAGE AND INTEGRATED CIRCUIT INCLUDING THE SAME

(71) Applicant: SAMSUNG ELECTRONICS CO., LTD., Suwon-si (KR)

(72) Inventors: Joo-Seong Kim, Seoul (KR); Kwang-Ho Kim, Yongin-si (KR); Sang-Ho Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 383 days.

(21) Appl. No.: 16/186,753

(22) Filed: Nov. 12, 2018

(65) Prior Publication Data
US 2019/0155323 A1 May 23, 2019

(30) Foreign Application Priority Data

Nov. 17, 2017 (KR) .................. 10-2017-0154194
Sep. 17, 2018 (KR) .................. 10-2018-0111030

(51) Int. Cl.
*G05F 3/26* (2006.01)
*H03F 3/45* (2006.01)
(Continued)

(52) U.S. Cl.
CPC ............... *G05F 3/267* (2013.01); *G01K 7/01* (2013.01); *G05F 3/00* (2013.01); *H03F 3/45071* (2013.01);
(Continued)

(58) Field of Classification Search
CPC ........... G05F 3/222; G05F 3/267; G05F 3/26; G05F 3/225; G01K 7/01; G01K 7/021; G01K 7/06; H03F 3/45
See application file for complete search history.

(56) References Cited

U.S. PATENT DOCUMENTS

| | | | |
|---|---|---|---|
| 4,087,758 A | 5/1978 | Hareyama | |
| 5,629,611 A * | 5/1997 | McIntyre | G05F 3/267 323/313 |

(Continued)

FOREIGN PATENT DOCUMENTS

| | | |
|---|---|---|
| CN | 101093401 A | 12/2007 |
| CN | 101599761 A | 12/2009 |

(Continued)

OTHER PUBLICATIONS

Chinese Office Action dated Aug. 23, 2021 Cited in Related Chinese Application No. 201811358057.3.

(Continued)

*Primary Examiner* — Hai L Nguyen
(74) *Attorney, Agent, or Firm* — Volentine, Whitt & Francos, PLLC

(57) ABSTRACT

A reference voltage generating circuit includes: an operational amplifier including a first input terminal connected to a first node and a second input terminal connected to a second node; a first transistor connected between a ground terminal and the first node, wherein a first current flows in the first transistor; a second transistor connected to the ground terminal; and a first variable resistor connected between the second transistor and the second node, wherein the first variable resistor has a first resistance value for adjusting the first current, based on a change in a current characteristic of the first transistor caused by a variation in a process of forming the first transistor. The reference voltage generating circuit provides a reference voltage, based on a voltage of the first node and a voltage across the first variable resistor.

16 Claims, 9 Drawing Sheets

(51) Int. Cl.
  *G01K 7/01* (2006.01)
  *G05F 3/00* (2006.01)
  *H03M 1/46* (2006.01)
  *H03M 1/08* (2006.01)

(52) U.S. Cl.
  CPC ... *H03F 3/45475* (2013.01); *H03F 2200/129* (2013.01); *H03F 2200/468* (2013.01); *H03F 2203/45116* (2013.01); *H03F 2203/45524* (2013.01); *H03M 1/089* (2013.01); *H03M 1/46* (2013.01)

(56) References Cited

U.S. PATENT DOCUMENTS

| | | | |
|---|---|---|---|
| 7,170,274 | B2 | 1/2007 | Mukherjee et al. |
| 7,768,343 | B1 | 8/2010 | Sinitsky |
| 8,390,363 | B2 | 3/2013 | Engl |
| 8,513,938 | B2 | 8/2013 | Tachibana et al. |
| 8,836,315 | B2 | 9/2014 | Satoh et al. |
| 8,941,369 | B2 | 1/2015 | Youssefi |
| 8,988,137 | B2 | 3/2015 | Furusawa et al. |
| 10,310,536 | B2 * | 6/2019 | Kim .................. G01K 7/01 |

FOREIGN PATENT DOCUMENTS

| | | | |
|---|---|---|---|
| CN | 202120153 U | | 1/2012 |
| CN | 104166521 A | | 11/2014 |
| CN | 104391534 A | | 3/2015 |
| CN | 106370314 A | | 2/2017 |
| CN | 107328485 A | | 11/2017 |
| KR | 10-2015-0104355 | * | 7/2015 |
| KR | 10-2017-0011551 A | | 2/2017 |

OTHER PUBLICATIONS

Korean Office Action dated Oct. 7, 2021, Cited in Corresponding Korean Patent Application No. 10-2018-0111030.

* cited by examiner

REFERENCE VOLTAGE GENERATING CIRCUIT METHOD OF GENERATING REFERENCE VOLTAGE AND INTEGRATED CIRCUIT INCLUDING THE SAME

CROSS-REFERENCE TO RELATED APPLICATIONS

This application claims the benefit of Korean Patent Application Nos. 10-2017-0154194 and 10-2018-0111030, respectively filed on Nov. 17, 2017 and Sep. 17, 2018, in the Korean Intellectual Property Office, the disclosures of which are incorporated herein in their entirety by reference.

BACKGROUND

The inventive concept relates to an integrated circuit, and more particularly, to a reference voltage generating circuit, a temperature sensor including the reference voltage generating circuit, an integrated circuit including the reference voltage generating circuit, and a method of correcting a current of a bipolar junction transistor (BJT) included in the integrated circuit to have a designed or desired value.

An element in integrated circuits may have a characteristic which depends on a temperature. For example, a threshold voltage of a transistor may vary when an ambient temperature of the transistor increases or decreases. An integrated circuit may include a temperature sensor for sensing a temperature of the integrated circuit, and may provide a function of compensating for a characteristic of an element which is dependent on temperature, based on a temperature code.

In integrated circuits, a reference voltage may be used for various purposes, and as an accuracy of the reference voltage is enhanced, the normal operation of the integrated circuits may be ensured, or the performance of the integrated circuits may be enhanced. For an element of an integrated circuit having a characteristic which changes as the temperature of an integrated circuit increases or decreases, the reference voltage may also be generated to vary based on a change in a temperature. When a variation of the reference voltage for an integrated circuit resulting from a temperature change in the integrated circuit causes the reference voltage to be inaccurate, a malfunction of the integrated circuit may occur.

SUMMARY

Aspects of the inventive concept provide a reference voltage generating circuit in which the precision of a reference voltage may be enhanced despite a variation in the process of forming one or more elements (e.g., a transistor) of the reference voltage generating circuit. Other aspects of the inventive concept provide: a temperature sensor including the reference voltage generating circuit, an integrated circuit including the reference voltage generating circuit, and a method of correcting a current of a bipolar junction transistor (BJT) included in the integrated circuit to have a designed or desired value.

According to an aspect of the inventive concept, there is provided a reference voltage generating circuit including: an operational amplifier including a first input terminal connected to a first node and further including a second input terminal connected to a second node; a first transistor connected between a ground terminal and the first node, wherein a first current flows in the first transistor; a second transistor connected to the ground terminal; and a first variable resistor connected between the second transistor and the second node, the first variable resistor having a first resistance value for adjusting the first current, based on a change in a current characteristic of the first transistor caused by a variation in a process of forming the first transistor, wherein the reference voltage generating circuit provides a reference voltage, based on a voltage of the first node and a voltage across the first variable resistor.

According to another aspect of the inventive concept, there is provided a temperature sensor including: a reference voltage generating circuit configured to generate first and second reference voltages which are constant regardless of temperature; a first voltage generating circuit configured to generate a first voltage proportional to the temperature, based on the second reference voltage; and an analog-to-digital converter (ADC) configured to produce a digital temperature signal, based on the first reference voltage and the first voltage. The reference voltage generating circuit includes: an operational amplifier which has a first input terminal connected to a first node and which has a second input terminal connected to a second node; a first transistor connected between a ground terminal and the first node, wherein a first current flows in the first transistor; a second transistor connected to the ground terminal; and a first variable resistor connected between the second transistor and the second node, the first variable resistor having a first resistance value for adjusting the first current, based on a change in a current characteristic of the first transistor caused by a variation in a process of forming the first transistor, and the first and second reference voltages are determined based on a voltage of the first node and a voltage across the first variable resistor.

According to still another aspect of the inventive concept, there is provided an integrated circuit including a reference voltage generating circuit configured to provide a reference voltage; and an internal circuit configured to operate based on the reference voltage. The reference voltage generating circuit includes: an operational amplifier including a first input terminal connected to a first node and further including a second input terminal connected to a second node; a first transistor connected between a ground terminal and the first node, wherein a first current flows in the first transistor; a second transistor connected to the ground terminal; and a first variable resistor connected between the second transistor and the second node, the first variable resistor having a first resistance value for correcting the first current, based on a change in a current characteristic of the first transistor caused by a variation in a process of forming the first transistor. The reference voltage generating circuit provides the reference voltage, based on a voltage of the first node and a voltage across the first variable resistor.

According to yet another aspect of the inventive concept, there is provided a method of correcting a current of an integrated circuit. The integrated circuit includes: a first bipolar junction transistor (BJT) and a second BJT each connected to a ground terminal; and a first variable resistor serially connected to the second BJT. The integrated circuit generates a reference voltage, based on a voltage across the first variable resistor. The method includes sensing a change in a current characteristic of the first BJT caused by a variation in a process of forming the first BJT, and varying a first resistance value of the first variable resistor so that an emitter current of the first BJT has an optimal value, based on the sensed change in the current characteristic.

According to a further aspect of the inventive concept, there is provided A device, comprising: an operational amplifier having a first input terminal connected to a first node, and having a second input terminal connected to a second node; a first transistor having a first terminal connected to the first node and having a second terminal connected to a ground node, and having a control terminal, wherein a first current flows in the first terminal of the first transistor; a second transistor having a first terminal, and having a second terminal connected to the ground node, and having a control terminal connected to the control terminal of the first transistor; a first variable resistor connected between the first terminal of the second transistor and the second node, the first variable resistor having a first resistance value for adjusting the first current based on a change in a current characteristic of the first transistor caused by a variation in a process of forming the first transistor; and a second variable resistor connected between the first node and a third node which is an output of the device, wherein the device is configured to output a reference voltage at the third node as a sum of a voltage between the control terminal and the first terminal of the first transistor and a voltage across the second variable resistor.

BRIEF DESCRIPTION OF THE DRAWINGS

Embodiments of the inventive concept will be more clearly understood from the following detailed description taken in conjunction with the accompanying drawings.

DETAILED DESCRIPTION OF THE EMBODIMENTS

Figure 1:
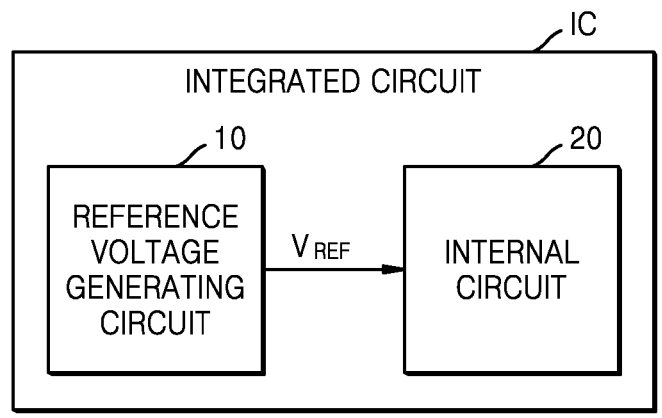
FIG. 1 is a block diagram illustrating an embodiment of an integrated circuit.

FIG. 1 is a block diagram illustrating an embodiment of an integrated circuit IC.

Referring to FIG. 1, the integrated circuit IC may include a reference voltage generating circuit 10 and an internal circuit 20. Reference voltage generating circuit 10 may provide a reference voltage $V_{REF}$ needed for an operation of internal circuit 20. Internal circuit 20 may be an intellectual property (IP) core or block for performing a certain operation in the integrated circuit IC.

An example of reference voltage generating circuit 10 may include a band gap reference (BGR) circuit. The BGR circuit may generate a certain voltage regardless of a variation of a source voltage and a temperature change. In detail, the BGR circuit may generate the certain voltage regardless of the temperature change, based on a first voltage which is proportional to a temperature and a second voltage which is inversely proportional to a temperature. Generally, the BGR circuit may include a bipolar junction transistor (BJT), and a variation in a process associated with forming the BJT (herein referred to as a "process variation" of the BJT) may occur due to a scaling of a semiconductor process. For example, a current characteristic (for example, an emitter current characteristic) of the BJT may vary due to the process variation, causing a reduction in a precision or accuracy of the reference voltage $V_{REF}$. Accordingly, a method of maintaining the current characteristic of the BJT to be constant or nearly constant despite process variation is needed.

Figure 2:
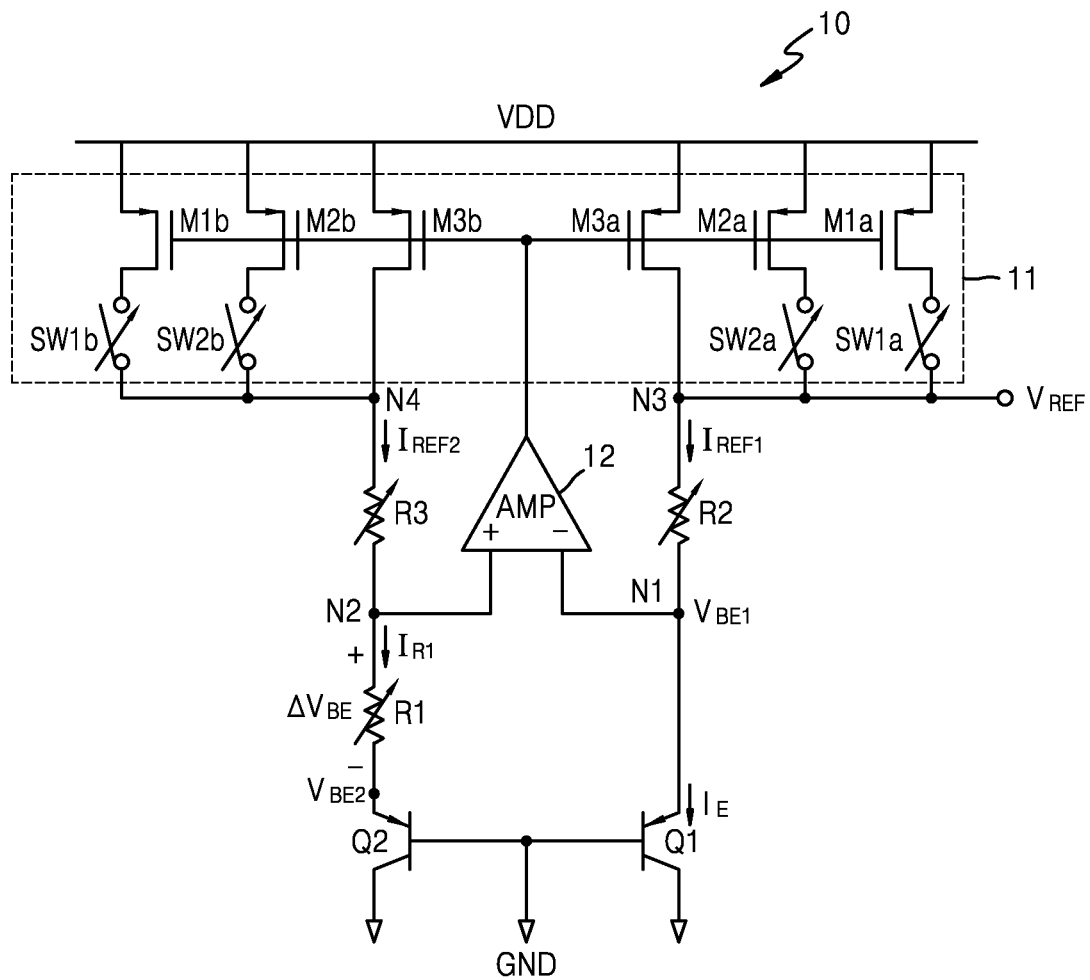
FIG. 2 is a circuit diagram illustrating an embodiment of a reference voltage generating circuit.

FIG. 2 is a circuit diagram illustrating an embodiment of reference voltage generating circuit 10.

Referring to FIG. 2, reference voltage generating circuit 10 may include a current source 11, first and second transistors Q1 and Q2, first to third variable transistors R1 to R3, and an operational amplifier 12. For example, each of the first and second transistors Q1 and Q2 may be implemented as a BJT. Hereinafter, the first and second transistors Q1 and Q2 may be respectively referred to as a first BJT Q1 and a second BJT Q2.

Current source 11 may include a plurality of P-channel metal oxide semiconductor (PMOS) transistors M1a, M2a, M3a, M1b, M2b, and M3b and a plurality of switches SW1a, SW2a, SW1b, and SW2b. Gates of the PMOS transistors M1a, M2a, M3a, M1b, M2b, and M3b may be connected to an output terminal of operational amplifier 12 in common, and thus, the PMOS transistors M1a, M2a, M3a, M1b, M2b, and M3b may be driven based on a voltage level of the output terminal of operational amplifier 12.

The PMOS transistor M1a may be connected between a source voltage terminal VDD and a third node N3 through the switch SW1a. The PMOS transistor M2a may be connected between the source voltage terminal VDD and the third node N3 through the switch SW2a. The PMOS transistor M3a may be connected between the source voltage terminal VDD and the third node N3. In an embodiment, a current supplied from current source 11 may be adjusted by controlling the switches SW1a and SW2a. In detail, a first reference current $I_{REF1}$ flowing in the second variable resistor R2 may be adjusted by controlling the switches SW1a and SW2a. For example, the first reference current $I_{REF1}$ may increase by turning on at least one of the switches SW1a and SW2a. In detail, the switches SW1a and SW2a may be selectively turned on based on a target increase amount of the first reference current $I_{REF1}$. As the target increase amount of the first reference current $I_{REF1}$ increases, the number of turned-on switches SW1a and SW2a may increase.

The PMOS transistor M1b may be connected between the source voltage terminal VDD and a fourth node N4 through the switch SW1b. The PMOS transistor M2b may be connected between the source voltage terminal VDD and the fourth node N4 through the switch SW2b. The PMOS transistor M3b may be connected between the source voltage terminal VDD and the fourth node N4. In an embodiment, the current supplied from current source 11 may be adjusted by controlling the switches SW1b and SW2b. In detail, a second reference current $I_{REF2}$ flowing in the third variable resistor R3 may be adjusted by controlling the switches SW1b and SW2b. For example, the second reference current $I_{REF2}$ may increase by turning on at least one of the switches SW1b and SW2b. In detail, the switches SW1b and SW2b may be selectively turned on based on a target increase amount of the second reference current $I_{REF2}$. As the target increase amount of the second reference current $I_{REF2}$ increases, the number of turned-on switches SW1b and SW2b may increase.

In FIG. 2, the reference voltage generating circuit 10 is illustrated as including six PMOS transistors M1a, M2a, M3a, M1b, M2b, and M3b, but embodiments are not limited thereto. The number of PMOS transistors configuring current source 11 may be variously changed. Also, in FIG. 2, reference voltage generating circuit 10 is illustrated as including four switches SW1a, SW2a, SW1b, and SW2b, but when the number of PMOS transistors is changed, the number of switches included in reference voltage generating circuit 10 may be variously changed. Furthermore, in some embodiments, reference voltage generating circuit 10 may be implemented with a current source including N-channel metal oxide semiconductor (NMOS) transistors instead of PMOS transistors.

The first BJT Q1 may be connected between a first node N1 and a ground terminal GND. The second BJT Q2 and the first variable resistor R1 may be serially connected between a second node N2 and the ground terminal GND. The second variable resistor R2 may be connected between the first node N1 and the third node N3, and the third variable resistor R3 may be connected between the second node N2 and the fourth node N4. A voltage of the third node N3 may be output as a reference voltage or a BGR voltage $V_{REF}$. In an embodiment, the third variable resistor R3 has a third resistance value proportional to the first resistance value of the first variable resistor R1. In an embodiment, the second resistance value of the second variable resistor R2 is substantially the same as the third resistance value.

The first BJT Q1 may include an emitter connected to the first node N1. Also, the first BJT Q1 may include a base and a collector connected to the ground terminal GND, and thus, the first BJT Q1 may be implemented as a diode-connected transistor. The first BJT Q1 may have a first size, and a first current $I_E$ may flow through the first BJT Q1. Hereinafter, the first current $I_E$ may be referred to as an emitter current.

The second BJT Q2 may include an emitter connected to the first variable resistor R1. Also, the second BJT Q2 may include a base and a collector connected to the ground terminal GND, and thus, the second BJT Q2 may be implemented as a diode-connected transistor. The second BJT Q2 may have a second size which is greater than the first size, and for example, the second size may be n (where n is a positive real number) times greater than the first size.

Operational amplifier 12 may include a first input terminal connected to the first node N1 and a second input terminal connected to the second node N2. For example, the first input terminal may be a negative input terminal, and the second input terminal may be a positive input terminal. Also, operational amplifier 12 may include the output terminal connected to current source 11.

Voltage levels of the first and second input terminals of operational amplifier 12 may be substantially the same, and thus, a voltage level of the first node N1 may be substantially the same as that of the second node N2. In this case, the voltage level of the first node N1 may correspond to a base-emitter voltage $V_{BE1}$ of the first BJT Q1, and a voltage level of the second node N2 may correspond to a sum of a base-emitter voltage $V_{BE2}$ of the second BJT Q2 and a voltage $\Delta V_{BE}$ across the first variable resistor R1. Accordingly, the voltage $\Delta V_{BE}$ across the first variable resistor R1 may be represented as in the following Equation (1):

$$\Delta V_{BE} = V_{BE1} - V_{BE2} \qquad (1)$$

Generally, a base-emitter voltage of a BJT may have a characteristic inversely proportional to temperature. Therefore, as the temperature increases, the base-emitter voltage $V_{BE1}$ of the first BJT Q1 may decrease and may be represented as in the following Equation (2), where, $V_T$ may be a thermal voltage, $I_S$ may be a saturation current of first BJT Q1, and $I_C$ may be a collector current:

$$V_{BE1} = V_T \ln \frac{I_c}{I_s} \qquad (2)$$

Also, as temperature increases, the base-emitter voltage $V_{BE2}$ of the second BJT Q2 may decrease and may be represented as in the following Equation (3).

$$V_{BE2} = V_T \ln \frac{I_c}{nI_s} \qquad (3)$$

The size of the second BJT Q2 may be n times the size of the first BJT Q1, and thus, a temperature-based variation of the base-emitter voltage $V_{BE2}$ of the second BJT Q2 may be greater than a temperature-based variation of the base-emitter voltage $V_{BE1}$ of the first BJT Q1. When Equations (2) and (3) are substituted into Equation (1), the voltage $\Delta V_{BE}$ across the first variable resistor R1 may be represented as in the following Equation (4):

$$\Delta V_{BE} = V_T \ln n \qquad (4)$$

In this case, the thermal voltage $V_T$ may be represented as in the following Equation (5):

$$V_T = \frac{kT}{q} \qquad (5)$$

Here T may denote an operation temperature, k may denote a Boltzmann constant, and q may denote an electric charge amount of an electron. When Equation (5) is substituted into Equation (4), the voltage $\Delta V_{BE}$ across the first variable resistor R1 may be represented as in the following Equation (6):

$$\Delta V_{BE} = \frac{kT}{q} \ln n \qquad (6)$$

Therefore, as the temperature increases, the voltage $\Delta V_{BE}$ across the first variable resistor R1 may increase, and a current flowing in the first variable resistor R1 may have a characteristic proportional to the temperature.

In reference voltage generating circuit 10, the first reference current $I_{REF1}$ flowing to the second variable resistor R2 through the PMOS transistors M1a, M2a, and M3a may be the same as the second reference current $I_{REF2}$ flowing to the third variable resistor R3 through the PMOS transistors M1b, M2b, and M3b. Therefore, reference voltage generating circuit 10 may generate a reference voltage $V_{REF}$ regardless of temperature. In the present embodiment, a voltage of the third node N3 may be output as the reference voltage $V_{REF}$. In this case, the reference voltage $V_{REF}$ may be represented as in the following Equation (7):

$$V_{REF} = V_{BE1} + \alpha \cdot \Delta V_{BE} \quad (7)$$

In Equation (7), $\alpha$ may correspond to a ratio of the second resistance value "r2" of the second variable resistor R2 of FIG. 2 to the first resistance value "r1" of the first variable resistor R1 of FIG. 1 (for example, $\alpha = r2/r1$)

As described above, a precision or accuracy of the reference voltage $V_{REF}$ may be affected by a $\Delta V_{BE}$ spread. Therefore, a method of reducing an influence of the $\Delta V_{BE}$ spread may enhance the precision or accuracy of the reference voltage $V_{REF}$. The $\Delta V_{BE}$ spread may vary based on the emitter current $I_E$ of the first BJT Q1. Accordingly, adjusting the emitter current $I_E$ of the first BJT Q1 to an optimal current region so as to minimize the $\Delta V_{BE}$ spread may enhance the precision or accuracy of the reference voltage $V_{REF}$.

According to an embodiment, a first resistance value "r1" of the first variable resistor R1 may vary for adjusting the emitter current $I_E$ of the first BJT Q1 to the optimal current region. A current $I_{R1}$ flowing in the first variable resistor R1 may be represented as in the following Equation (8):

$$I_{R1} = \frac{\Delta V_{BE}}{r_1} \quad (8)$$

In equation (8), r1 may denote the first resistance value of the first variable resistor R1. According to an embodiment, in order to adjust the emitter current $I_E$ of the first BJT Q1 to the optimal current region, the current $I_{R1}$ corresponding to the emitter current $I_E$ may be set to the optimal current region, and the first resistance value "r1" of the first variable resistor R1 may be adjusted based on the current $I_{R1}$. Hereinafter, this will be described in more detail with reference to FIGS. 3 and 4.

Figure 3:
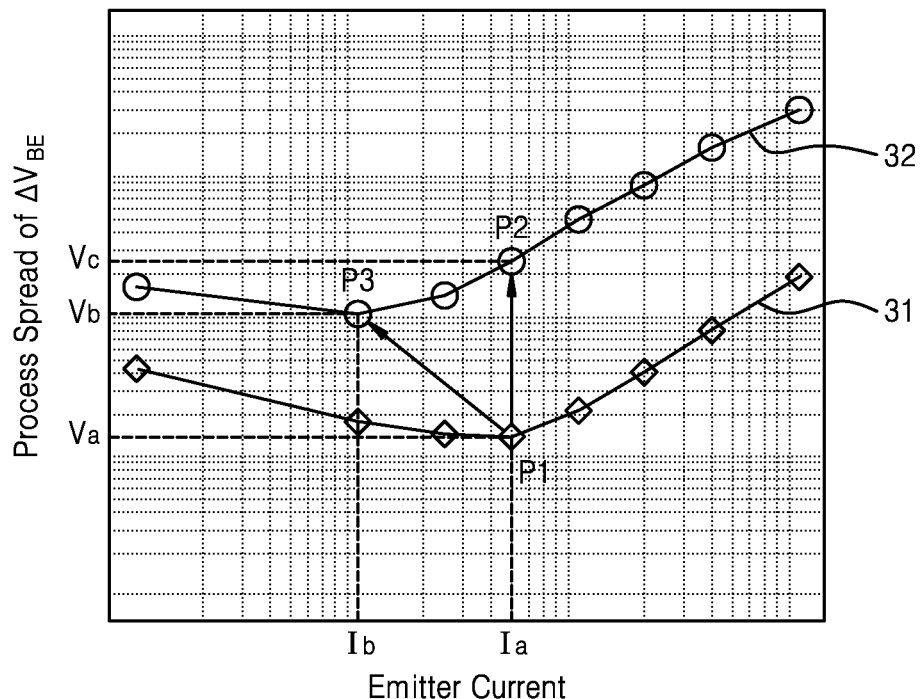
FIG. 3 is a graph showing an example of a $\Delta V_{BE}$ spread characteristic with respect to an emitter current of a first bipolar junction transistor (BJT) of FIG. 2.

FIG. 3 is a graph showing an example of a $\Delta V_{BE}$ spread characteristic with respect to the emitter current of the first BJT Q1 of FIG. 2.

Referring to FIG. 3, the abscissa axis represents the emitter current of the first BJT Q1 and the ordinate axis represents a $\Delta V_{BE}$ spread. In this case, a $\Delta V_{BE}$ spread may have the form of a quadratic curve with respect to the emitter current. This is because, when the emitter current is in a high current region, the $\Delta V_{BE}$ spread is affected by an influence of an emitter resistor, and when the emitter current is in a low current region, the $\Delta V_{BE}$ spread is affected by an influence of a leakage current.

Hereinafter, the $\Delta V_{BE}$ spread based on the emitter current of the first BJT Q1 may be referred to as a current characteristic of the first BJT Q1. A first curve 31 represents a $\Delta V_{BE}$ spread of an initial process, and a second curve 32 represents a ΔVBE spread after a process performed in forming a BJT (herein referred to as "a process performed on a BJT") is changed. For example, compared to first curve 31, the ΔVBE spread of second curve 32 may totally increase. In this manner, the current characteristic of the first BJT Q1 may be changed based on changing a process performed on a BJT.

As represented in Equation (7), the reference voltage $V_{REF}$ may be affected by the $\Delta V_{BE}$ spread by a factor $\alpha$, whereby an influence of the $\Delta V_{BE}$ spread on the reference voltage $V_{REF}$ may increase. Therefore, it is desired to design reference voltage generating circuit 10 to operate in an optimal current region of a BJT, for minimizing the $\Delta V_{BE}$ spread. In other words, it is desired to set the emitter current $I_E$ of the first BJT Q1, included in reference voltage generating circuit 10, to an emitter current where the $\Delta V_{BE}$ spread is lowest.

In first curve 31, an emitter current at a first point P1 where the $\Delta V_{BE}$ spread is lowest may be Ia, and the $\Delta V_{BE}$ spread may be Va. For example, when Va is 1 mV and a target level of $\Delta V_{BE}$ is 60 mV, the $\Delta V_{BE}$ spread may be 59 mV to 61 mV at the first point P1. Therefore, in an initial process, the emitter current $I_E$ of the first BJT Q1 may be set to Ia with respect to the first point P1 where the $\Delta V_{BE}$ spread is lowest. In this case, Ia may be referred to as an optimal emitter current of an initial process.

However, a process performed on a BJT may be changed in a process for manufacturing an integrated circuit IC including reference voltage generating circuit 10. In other words, a process variation of the BJT may occur. For example, when a contact length or a doping concentration for forming the PMOS transistors M1a, M2a, M3a, M1b, M2b, and M3b of FIG. 2 is changed, the process performed on the BJT may be parasitically changed. Since the process performed on the BJT is changed, the current characteristic of the first BJT Q1 may be changed from first curve 31 to second curve 32.

In second curve 32, an emitter current at a third point P3 where a $\Delta V_{BE}$ spread is lowest may be Ib, and the $\Delta V_{BE}$ spread may be Vb. For example, when Vb is 10 mV and a target level of $\Delta V_{BE}$ is 60 mV, $\Delta V_{BE}$ may be 50 mV to 70 mV at the third point P3. For example, after a process being changed, when reference voltage generating circuit 10 is designed based on the optimal emitter current Ia of the initial process, the $\Delta V_{BE}$ spread may be Vc, which is greater than Vb. Therefore, the reference voltage $V_{REF}$ output from reference voltage generating circuit 10 may be reduced in precision or accuracy. As described above, since the process performed on the BJT is changed, the optimal current region may be changed to be different from that of the initial design, causing the reduction in precision or accuracy of the reference voltage $V_{REF}$.

Referring to FIGS. 2 and 3, the first resistance value "r1" of the first variable resistor R1 may vary for adjusting the emitter current $I_E$ from Ia, set in the initial process, to Ib after the process is changed. In this case, an optimal region of the emitter current $I_E$ may be reduced, and thus, the first resistance value "r1" of the first variable resistor R1 may increase compared to an initial setting value. In the related art, after a process is changed, a lowest point P1 of a $\Delta V_{BE}$ spread of an initial process may be changed to a second point P2 instead of a lowest point of second curve 32. However, according to the present embodiment, after the process is changed, the lowest point P1 of the $\Delta V_{BE}$ spread of the initial process may be changed to the third point P3 corresponding to the lowest point of second curve 32.

Figure 4:
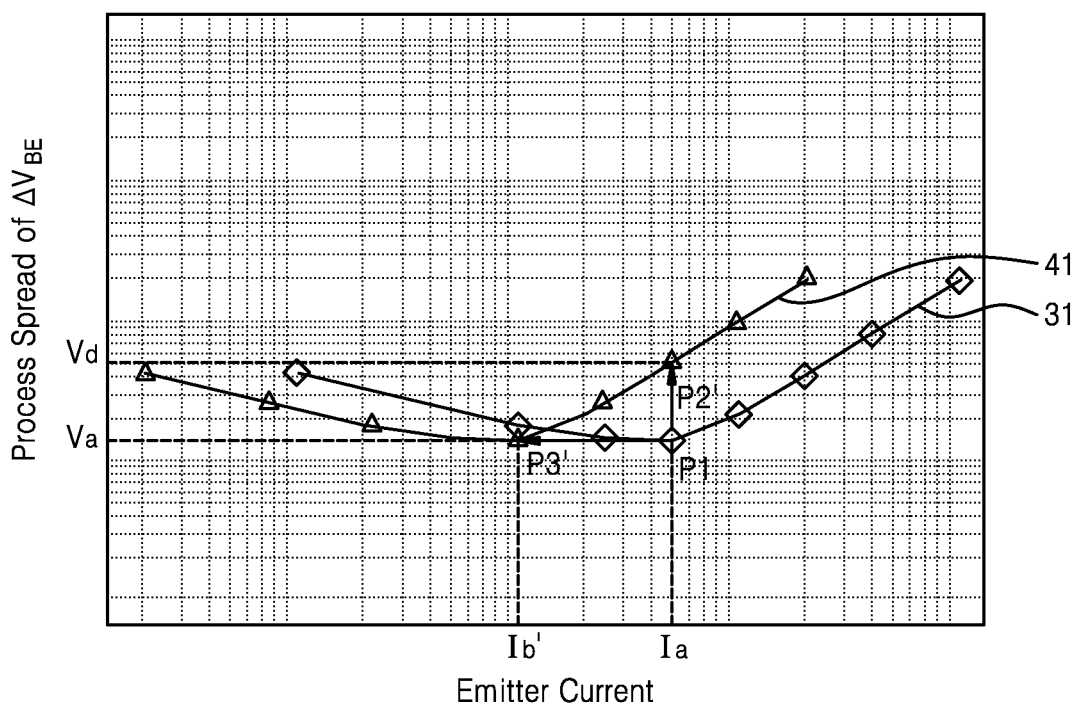
FIG. 4 is a graph showing another example of a $\Delta V_{BE}$ spread characteristic with respect to an emitter current of the first BJT of FIG. 2.

FIG. 4 is a graph showing another example of a $\Delta V_{BE}$ spread characteristic with respect to the emitter current of the first BJT Q1 of FIG. 2.

Referring to FIG. 4, the abscissa axis represents the emitter current of the first BJT Q1 and the ordinate axis represents a $\Delta V_{BE}$ process spread. A first curve 31 represents a $\Delta V_{BE}$ spread of an initial process, and a second curve 41 represents a $\Delta V_{BE}$ spread after a process is changed. For example, second curve 41 may be shifted more leftward than first curve 31. However, this is merely an embodiment. In other embodiments, the $\Delta V_{BE}$ spread after a process is changed may be shifted more rightward than first curve 31. Hereinafter, a difference with FIG. 3 will be mainly described.

In first curve 31, an emitter current at a first point P1 where a $\Delta V_{BE}$ spread is lowest may be Ia, and the $\Delta V_{BE}$ spread may be Va. In second curve 41, an emitter current at a third point P3' where a $\Delta V_{BE}$ spread is lowest may be Ib', and the $\Delta V_{BE}$ spread may be Va. For example, after a process is changed, when reference voltage generating circuit 10 is designed based on the optimal emitter current Ia of the initial process, the $\Delta V_{BE}$ spread may be Vd, which is greater than Va. Therefore, the reference voltage $V_{REF}$ output from reference voltage generating circuit 10 may be reduced in precision or accuracy. As described above, since the process performed on the BJT is changed, the optimal current region may be changed to be different from that of the initial design, causing the reduction in precision or accuracy of the reference voltage $V_{REF}$.

Referring to FIGS. 2 and 4, the first resistance value "r1" of the first variable resistor R1 may vary for adjusting the emitter current $I_E$ from Ia, set in the initial process, to Ib' after the process is changed. In this case, an optimal region of the emitter current $I_E$ may be reduced, and thus, the first resistance value "r1" of the first variable resistor R1 may increase compared to an initial setting value. In the related art, after a process is changed, a lowest point P1 of a $\Delta V_{BE}$ spread of an initial process may be changed to a second point P2' instead of a lowest point of second curve 41. However, according to the present embodiment, after the process is changed, the lowest point P1 of the $\Delta V_{BE}$ spread of the initial process may be changed to a third point P3' corresponding to the lowest point of second curve 41.

As described above with reference to FIGS. 3 and 4, since a process performed on a BJT is changed, a current characteristic of the BJT may be changed, and thus, when reference voltage generating circuit 10 is designed based on an optimal emitter current which is set in an initial process, a $\Delta V_{BE}$ spread may increase, causing the reduction in precision or accuracy of the reference voltage $V_{REF}$. Accordingly, according to the present embodiment, in order to reflect a movement of an optimal current region caused by the changing of the process performed on the BJT, the first resistance value "r1" of the first variable resistor R1 may be adjusted, thereby adjusting the emitter current $I_E$ of the first BJT Q1.

Referring again to FIG. 2, according to an embodiment, the first resistance value "r1" of the first variable resistor R1 may be changed, and thus, a second resistance value "r2" of the second variable resistor R2 may also be changed. As explained above, in Equation (7), a may correspond to a ratio of the second resistance value "r2" of the second variable resistor R2 to the first resistance value "r1" of the first variable resistor R1 (for example, α=r2/r1). However, as described above, when the first resistance value "r1" of the first variable resistor R1 varies to minimize a $\Delta V_{BE}$ spread caused by a process variation, α may be changed, and the reference voltage $V_{REF}$ may vary. In other words, when the first resistance value "r1" of the first variable resistor R1 is corrected, a ratio (for example, α=r2/r1) of the second resistance value "r2" to the first resistance value "r1" may be changed, the reference voltage $V_{REF}$ output from reference voltage generating circuit 10 as a function of temperature may be changed. Accordingly, according to an embodiment, the second resistance value "r2" of the second variable resistor R2 may vary when the first resistance value "r1" of the first variable resistor R1 is varied so as to maintain a previously designed ratio "r2/r1".

Furthermore, according to an embodiment, a size ratio "W/L" of a width "W" to a length "L" of each of the PMOS transistors M1a, M2a, M3a, M1b, M2b, and M3b included in current source 11 may be changed. In detail, a bias point of current source 11 implemented with the PMOS transistors M1a, M2a, M3a, M1b, M2b, and M3b may be changed based on a variation of the emitter current $I_E$. For example, a drain-source voltage margin or a gate-source voltage margin of each of the PMOS transistors M1a, M2a, M3a, M1b, M2b, and M3b may be changed, and thus, a size ratio (i.e., the size ratio "W/L" of the width "W" to the length "L" of each of the PMOS transistors M1a, M2a, M3a, M1b, M2b, and M3b) of each of the PMOS transistors M1a, M2a, M3a, M1b, M2b, and M3b may be changed for recovering a previously designed bias point.

As described above, according to embodiments, in reference voltage generating circuit 10, when a process variation of at least one of the first and second BJTs Q1 and Q2 occurs, a $\Delta V_{BE}$ spread may increase, and thus, in order to minimize the increase in the $\Delta V_{BE}$ spread, the emitter current $I_E$ of the first BJT Q1 may be moved to the optimal current region. Therefore, despite a process variation of at least one of the first and second BJTs Q1 and Q2, reference voltage generating circuit 10 may provide the reference voltage $V_{REF}$ with a high degree of precision or accuracy.

Figure 5:
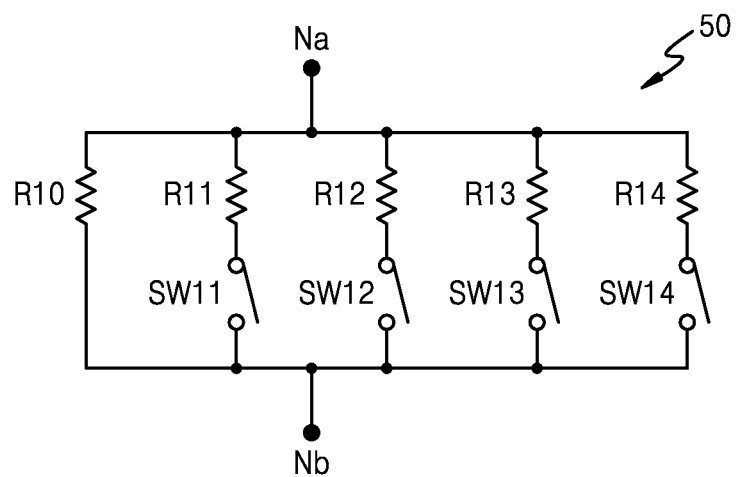
FIGS. 5, 6 and 7 illustrate embodiments of variable resistors.

FIG. 5 illustrates an embodiment of variable resistor 50.

Referring to FIG. 5, variable resistor 50 may correspond to any one or more of the first to third variable resistors R1 to R3 of FIG. 2. Variable resistor 50 may include a plurality of resistors R11 to R14 and a plurality of switches SW11 to SW14. The resistor R10 may be connected between a first node Na and a second node Nb, the resistor R11 and the switch SW11 may be serially connected between the first node Na and the second node Nb, the resistor R12 and the switch SW12 may be serially connected; between the first node Na and the second node Nb, the resistor R13 and the switch SW13 may be serially connected between the first node Na and the second node Nb, and the resistor R14 and the switch SW14 may be serially connected between the first node Na and the second node Nb. However, embodiments are not limited thereto, and the number of resistors and switches may be variously changed in other embodiments.

According to the present embodiment, in order to decrease a current characteristic change of a BJT caused by a process variation, variable resistor 50 may be changed to have a resistance value which differs from an initial design value. Therefore, the resistance value of variable resistor 50 may vary by controlling the switches SW11 to SW14 to be turned on/off. In other words, the switches SW11 to SW14 may be turned on/off to produce the desired or target resistance value of variable resistor 50. For example, as the desired or target resistance value decreases, the number of switches, which are turned on, among the switches SW11 to SW14 may increase.

Figure 6:
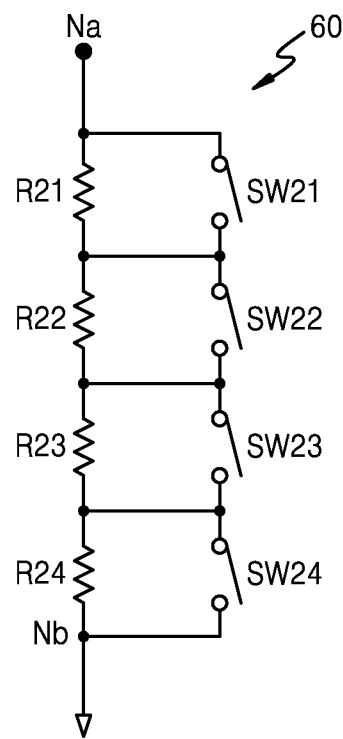

FIG. 6 illustrates another embodiment of a variable resistor 60.

Referring to FIG. 6, variable resistor 60 may correspond to any one or more of the first to third variable resistors R1 to R3 of FIG. 2. Variable resistor 60 may include a plurality of resistors R21 to R24 and a plurality of switches SW21 to SW24. The plurality of resistors R21 to R24 may be serially connected between a first node Na and a second node Nb, the switch SW21 may be connected in parallel across the resistor R21, the switch SW22 may be connected in parallel across the resistor R22, the switch SW23 may be connected in parallel across the resistor R23, and the switch SW24 may be connected in parallel across the resistor R24. However, embodiments are not limited thereto, and the number of resistors and switches may be variously changed in other embodiments.

According to the present embodiment, in order to decrease a current characteristic change of a BJT caused by a process variation, variable resistor 60 may be changed to have a resistance value which differs from an initial design value. Therefore, the resistance value of variable resistor 60 may vary by controlling the switches SW21 to SW24 to be turned on/off. In other words, the switches SW21 to SW24 may be turned on/off to produce the desired or target resistance value of variable resistor 60.

Figure 7:
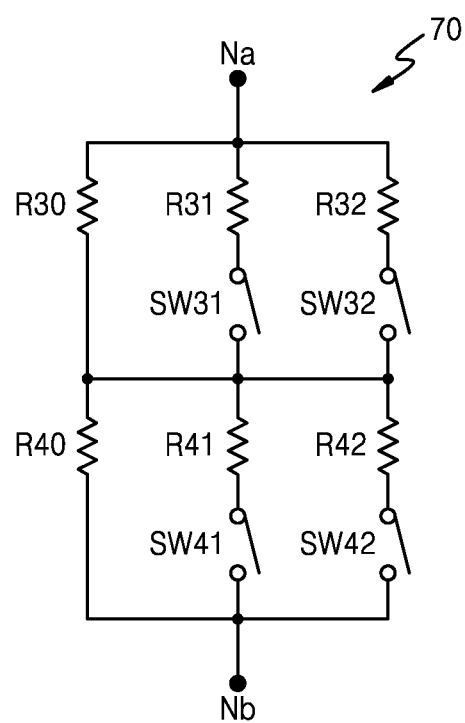

FIG. 7 illustrates yet another embodiment of a variable resistor 70.

Referring to FIG. 7, variable resistor 70 may correspond to any one or more of the first to third variable resistors R1 to R3 of FIG. 2. Variable resistor 70 may include a plurality of resistors R30 to R32 and R40 to R42 and a plurality of switches SW31, SW32, SW41, and SW42. Resistors R30 and R40 may be serially connected between a first node Na and a second node Nb, the resistor R31 and the switch SW31 may be connected in parallel across the resistor R30, and the resistor R32 and the switch SW32 may also be connected in parallel across the resistor R30. Also, the resistor R41 and the switch SW41 may be connected in parallel across the resistor R40, and the resistor R42 and the switch SW42 may also be connected in parallel across the resistor R40. However, embodiments are not limited thereto, and the number of resistors and switches may be variously changed in other embodiments.

According to the present embodiment, in order to decrease a current characteristic change of a BJT caused by a process variation, variable resistor 70 may be changed to have a resistance value which differs from an initial design value. Therefore, the resistance value of variable resistor 70 may vary by controlling the switches SW31, SW32, SW41, and SW42 to be turned on/off. In other words, the switches SW31, SW32, SW41, and SW42 may be turned on/off to produce the desired or target resistance value of variable resistor 70.

Figure 8:
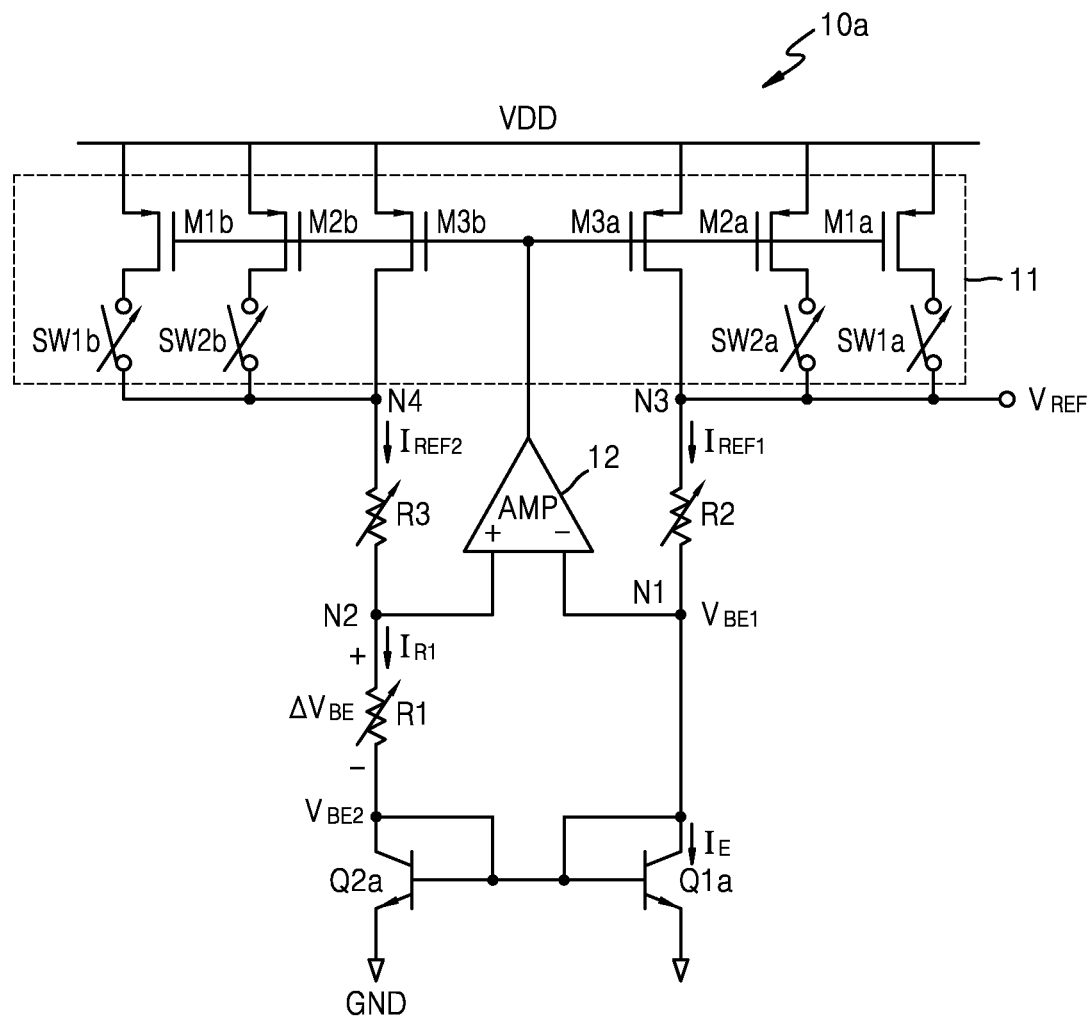
FIG. 8 is a circuit diagram illustrating an embodiment of a reference voltage generating circuit.

FIG. 8 is a circuit diagram illustrating an embodiment of a reference voltage generating circuit 10a.

Referring to FIG. 8, reference voltage generating circuit 10a may include current source 11, first and second transistors Q1a and Q2a, first to third variable transistors R1 to R3, and operational amplifier 12. Hereinafter, the first and second transistors Q1a and Q2a may be respectively referred to as a first BJT Q1a and a second BJT Q2a. Reference voltage generating circuit 10a according to the present embodiment may correspond to a modification of reference voltage generating circuit 10 of FIG. 2, and an overlapping description will be omitted.

The first BJT Q1a may be connected between a first node N1 and a ground terminal GND. The second BJT Q2a and the first variable resistor R1 may be serially connected between a second node N2 and the ground terminal GND. The second variable resistor R2 may be connected between the first node N1 and a third node N3, and the third variable resistor R3 may be connected between the second node N2 and a fourth node N4. A voltage of the third node N3 may be output as a reference voltage or a BGR voltage $V_{REF}$.

The first BJT Q1a may include a base and a collector connected to the first node N1, and thus, the first BJT Q1a may be implemented as a diode-connected transistor. Also, the first BJT Q1a may include an emitter connected to the ground terminal GND. The first BJT Q1a may have a first size, and a first current $I_E$ may flow through the first BJT Q1a. Hereinafter, the first current $I_E$ may be referred to as an emitter current.

The second BJT Q2a may include a base and a collector connected to the first variable resistor R1, and thus, the second BJT Q2a may be implemented as a diode-connected transistor. Also, the second BJT Q2a may include an emitter connected to the ground terminal GND. The second BJT Q2a may have a second size which is greater than the first size, and for example, the second size may be n (where n is a positive real number) times greater than the first size.

Figure 9:
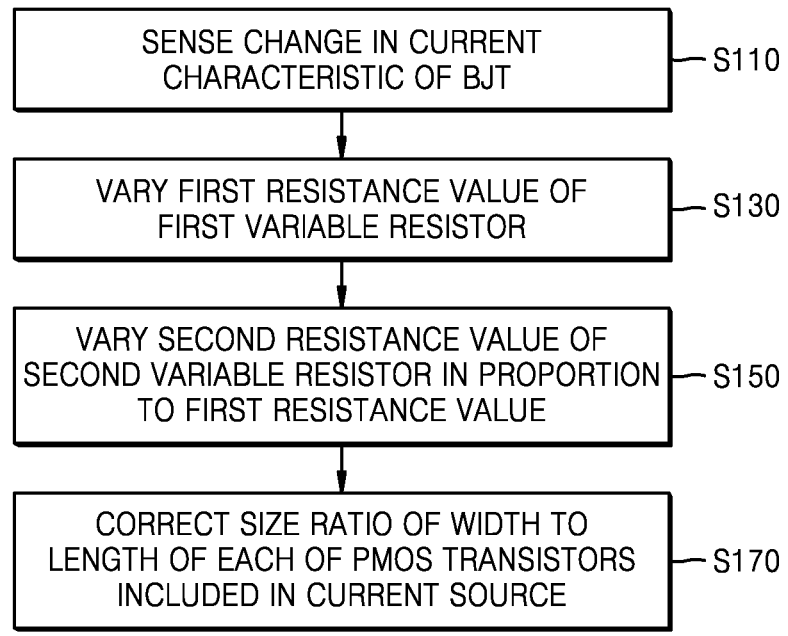
FIG. 9 is a flowchart illustrating an embodiment of a method of adjusting a current of a BJT included in an integrated circuit.

FIG. 9 is a flowchart illustrating an embodiment of a method of adjusting a current of a BJT included in an integrated circuit.

Referring to FIG. 9, the method of correcting the current of the BJT according to the present embodiment may correspond to a method of correcting the current of the BJT when a current characteristic of the BJT is changed by changing a process performed on the BJT. For example, the method according to the present embodiment may be performed before releasing a product of an integrated circuit. Hereinafter, the method of correcting the current of the BJT according to the present embodiment will be described with reference to FIGS. 2 and 9.

In operation S110, a change in the current characteristic of the BJT caused by a process variation of the BJT may be sensed. For example, due to the process variation or the changing of the process performed on the BJT, a $\Delta V_{BE}$ spread of an emitter current of the BJT may be changed as in FIG. 3 or 4. Accordingly, the change in the current characteristic of the BJT may be sensed by sensing a variation of the $\Delta V_{BE}$ spread caused by a variation of the emitter current of the BJT.

In operation S130, the first resistance value "r1" of the first variable resistor R1 may vary based on the sensed current characteristic change. In this case, the first resistance value "r1" of the first variable resistor R1 may vary in order for the emitter current of the BJT to have an optimal value. For example, as in the third point P3 of FIG. 3 or the third point P3' of FIG. 4, the first resistance value "r1" of the first variable resistor R1 may vary to set an emitter current corresponding to a lowest point of the $\Delta V_{BE}$ spread.

In operation S150, the second resistance value "r2" of the second variable resistor R2 may vary so as to be proportional to the first resistance value "r1". As in Equation (7), the reference voltage $V_{REF}$ may vary based on a ratio of the second resistance value "r2" of the second variable resistor R2 to the first resistance value "r1" of the first variable resistor R1. Therefore, when the first resistance value "r1" varies in operation S130, the second resistance value "r2" of the second variable resistor R2 may vary to maintain a previously designed ratio "r2/r1".

In operation S170, a size ratio "W/L" of a width "W" to a length "L" of each of the PMOS transistors M1a, M2a, M3a, M1b, M2b, and M3b included in current source 11 may be adjusted. A bias point of current source 11 implemented with the PMOS transistors M1a, M2a, M3a, M1b, M2b, and M3b may be changed based on a variation of an emitter current, and thus, a previously designed bias point may be recovered by adjusting the size ratio "W/L" of the width "W" to the length "L" of each of the PMOS transistors M1a, M2a, M3a, M1b, M2b, and M3b.

Figure 10:
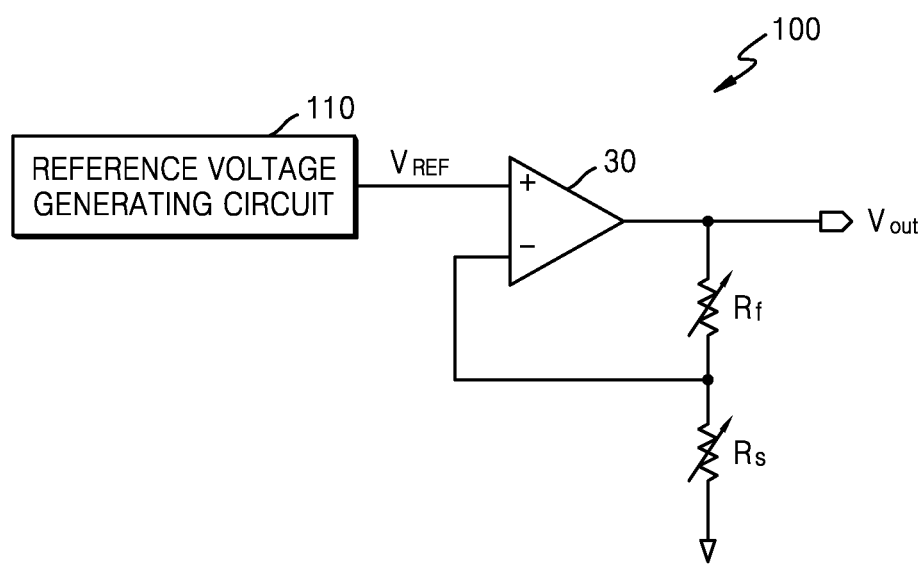
FIG. 10 is a circuit diagram illustrating a voltage regulator circuit including an embodiment of a reference voltage generating circuit.

FIG. 10 is a circuit diagram illustrating a voltage regulator circuit 100 including an embodiment of a reference voltage generating circuit.

Referring to FIG. 10, voltage regulator circuit 100 may include a reference voltage generating circuit 110, an amplifier 30, and a plurality of resistors Rf and Rs. For example, reference voltage generating circuit 110 may be implemented like reference voltage generating circuit 10 or 10a illustrated in FIG. 2 or 8. An output voltage Vout generated by amplifier 30 may be represented as in Equation (9):

$$V_{out} = V_{REF} \cdot \left(1 + \frac{R_f}{R_s}\right) \quad (9)$$

Therefore, voltage regulator circuit 100 may control resistance values of the resistors Rf and Rs to generate an output voltage Vout having a desired voltage level.

Figure 11:
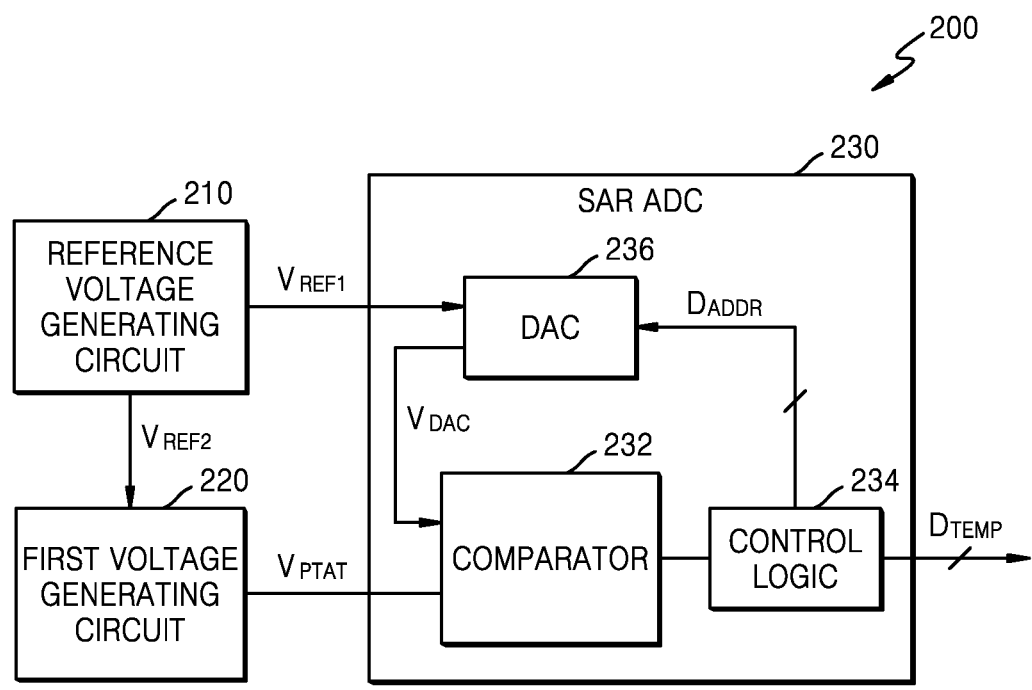
FIG. 11 is a block diagram illustrating a temperature sensor including an embodiment of a reference voltage generating circuit.

FIG. 11 is a block diagram illustrating a temperature sensor 200 including an embodiment of a reference voltage generating circuit.

Referring to FIG. 11, temperature sensor 200 may include a reference voltage generating circuit 210, a first voltage generating circuit 220, and an analog-to-digital converter (ADC) 230. For example, reference voltage generating circuit 210 may be implemented similar to the reference voltage generating circuit 10 or 10a illustrated in FIG. 2 or 8. Reference voltage generating circuit 210 may generate first and second reference voltages $V_{REF1}$ and $V_{REF2}$ which are independent or nearly independent of temperature. In an embodiment, the first and second reference voltages $V_{REF1}$ and $V_{REF2}$ may have different voltage levels than each other. For example, the first reference voltage $V_{REF1}$ may have a voltage level which is greater than that of the second reference voltage $V_{REF2}$.

The first reference voltage $V_{REF1}$ may be provided to ADC 230, and the second reference voltage $V_{REF2}$ may be provided to first voltage generating circuit 220. In an embodiment, by using a BGR circuit, reference voltage generating circuit 210 may have the first and second reference voltages $V_{REF1}$ and $V_{REF2}$ which have certain voltage levels despite a change in temperature.

First voltage generating circuit 220 may generate a first voltage $V_{PTAT}$ proportional to a temperature, based on the second reference voltage $V_{REF2}$. First voltage generating circuit 220 may generate an internal voltage in inverse proportion to a temperature and may generate the first voltage $V_{PTAT}$ from the second reference voltage $V_{REF2}$ and the internal voltage. First voltage generating circuit 220 may subtract the internal voltage from the second reference voltage $V_{REF2}$ to generate the first voltage $V_{PTAT}$ proportional to temperature.

ADC 230 may generate a digital temperature signal $D_{TEMP}$, based on the first reference voltage $V_{REF1}$ and the first voltage $V_{PTAT}$ proportional to temperature. The digital temperature signal $D_{TEMP}$ may be provided as temperature information about a mobile device (for example, device 300 of FIG. 12) including temperature sensor 200. ADC 230 may include a comparator 232, a control logic 234, and a digital-to-analog converter (DAC) 236.

Comparator 232 may compare the first voltage $V_{PTAT}$ with a second voltage $V_{DAC}$ provided from DAC 236 and may output a result of the comparison to control logic 234. Control logic 234 may generate a first control code $D_{ADDR}$, based on the result of the comparison by comparator 232, and may provide the first control code $D_{ADDR}$ to DAC 236. In response to the first control code $D_{ADDR}$, DAC 236 may generate the second voltage $V_{DAC}$, based on the first reference voltage $V_{REF1}$. Control logic 234 may generate the first control code $D_{ADDR}$ which allows a level of the second voltage $V_{DAC}$ to be equal to a level of the first voltage $V_{PTAT}$, and may generate the digital temperature signal $D_{TEMP}$ corresponding to the first control code $D_{ADDR}$.

ADC 230 may repeat an operation of comparing a level of the first voltage $V_{PTAT}$ with a level of the second voltage $V_{DAC}$ until the level of the first voltage $V_{PTAT}$ becomes equal to the level of the second voltage $V_{DAC}$, generating the first control code $D_{ADDR}$ according to a result of the comparison, and varying the level of the second voltage $V_{DAC}$, based on the first control code $D_{ADDR}$.

According to an embodiment, by using a successive approximation register (SAR), ADC 230 may estimate the second voltage $V_{DAC}$ which is to be compared by comparator 232, based on a result of comparison by comparator 232. In this case, ADC 230 may be referred to as an SAR ADC. In this case, SAR ADC 230 may perform correction in a direction from a most significant bit to a least significant bit to approximate the second voltage $V_{DAC}$ to the first voltage $V_{PTAT}$ and may generate the digital temperature signal $D_{TEMP}$ closest to the first voltage $V_{PTAT}$.

Due to a change in a current characteristic of a BJT caused by the changing of a process performed on the BJT, temperature sensor 200 may be reduced in precision for accurately sensing a temperature change. Particularly, when reference voltage generating circuit 210 generates a reference voltage having precision or accuracy which may be reduced due to the changing of the process performed on the BJT, then the precision of temperature sensor 200 may be reduced. However, according to the present embodiment, reference voltage generating circuit 210 may be implemented as illustrated in FIG. 2 or 8 and may correct an emitter current of the BJT included in reference voltage generating circuit 210. Accordingly, the precision or accuracy of temperature sensor 200 may be enhanced.

Figure 12:
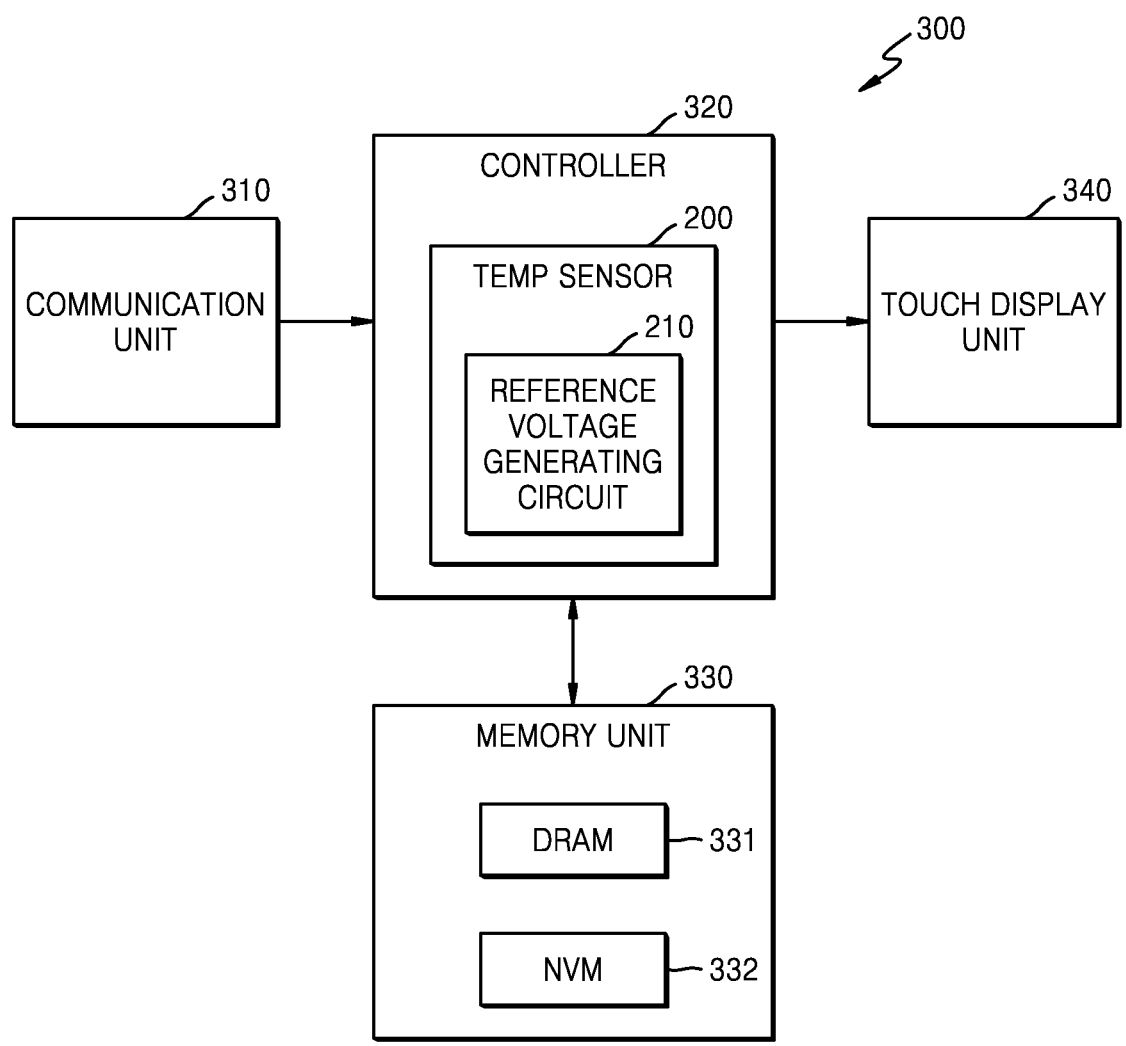
FIG. 12 is a block diagram illustrating a mobile device including an embodiment of a temperature sensor.

FIG. 12 is a block diagram illustrating a mobile device 300 including an embodiment of a temperature sensor.

Referring to FIG. 12, mobile device 300 may include a communication unit 310, a controller 320, a memory unit 330, and a touch display unit 340. Communication unit 310 may transmit or receive a wireless signal of data input/output through an antenna, or may transmit or receive data of a computer system connected thereto through a universal serial bus (USB) port. Controller 320 may control and process an overall operation of mobile device 300.

Memory unit 330 may store various programs and data for an overall operation of mobile device 300. Memory unit 330 may include at least one dynamic random access memory (DRAM) 331 and at least one non-volatile memory 332. DRAM 331 may temporarily store data obtained through processing by mobile device 300 according to control by controller 320. Non-volatile memory 332 may include at least one flash memory. Non-volatile memory 332 may download a bootloader and an operating system (OS) of mobile device 300 and may perform a mass storage function of mobile device 300. Non-volatile memory 332 may be an embedded memory card using a secure digital/multi-media card (SD/MMC) interface protocol. Non-volatile memory 332 may receive, through an SD/MMC interface, data stored in DRAM 331 and may store the received data.

Touch display unit 340 may include a display panel which displays numbers, characters, and state information generated when an operation of mobile device 300 is being performed. Touch display unit 340 may display version information and a list of content stored in non-volatile memory 332 according to control by controller 320. The display panel may be implemented with a flat display panel such as an organic light-emitting display panel including a plurality of light-emitting devices, a liquid crystal display panel, or the like.

Since an operation speed of mobile device 300 increases and a number of elements are integrated into mobile device 300, much heat may occur in mobile device 300. In order for mobile device 300 to stably operate without thermal runaway, temperature management or temperature monitoring performed on mobile device 300 is needed. Also, before an electric charge of a memory cell is lost due to a leakage current, DRAM 331 of memory unit 330 may perform a refresh operation to sense and rewrite data. A leakage current of DRAM 331 may have temperature dependence where the leakage current decreases at a low temperature and increases at a high temperature. DRAM 331 may change a refresh operation so that a refresh period is set to be longer at a low temperature and is set to be shorter at a high temperature, thereby reducing the power consumption of DRAM 331. To this end, temperature sensor 200 for accurately sensing a temperature change is needed.

In mobile device 300, controller 320 may include temperature sensor 200, and temperature sensor 200 may sense an internal temperature of mobile device 300. Temperature sensor 200 may include reference voltage generating circuit 210, and reference voltage generating circuit 210 may be implemented substantially similar to reference voltage generating circuit 10 or 10*a* illustrated in FIG. 2 or 8. According to an embodiment, temperature sensor 200 may be included in another element (for example, communication unit 310, memory unit 330, or touch display unit 340), other than controller 320, of mobile device 300. According to another embodiment, temperature sensor 200 may be provided as a separate integrated circuit of mobile device 300.

Figure 13:
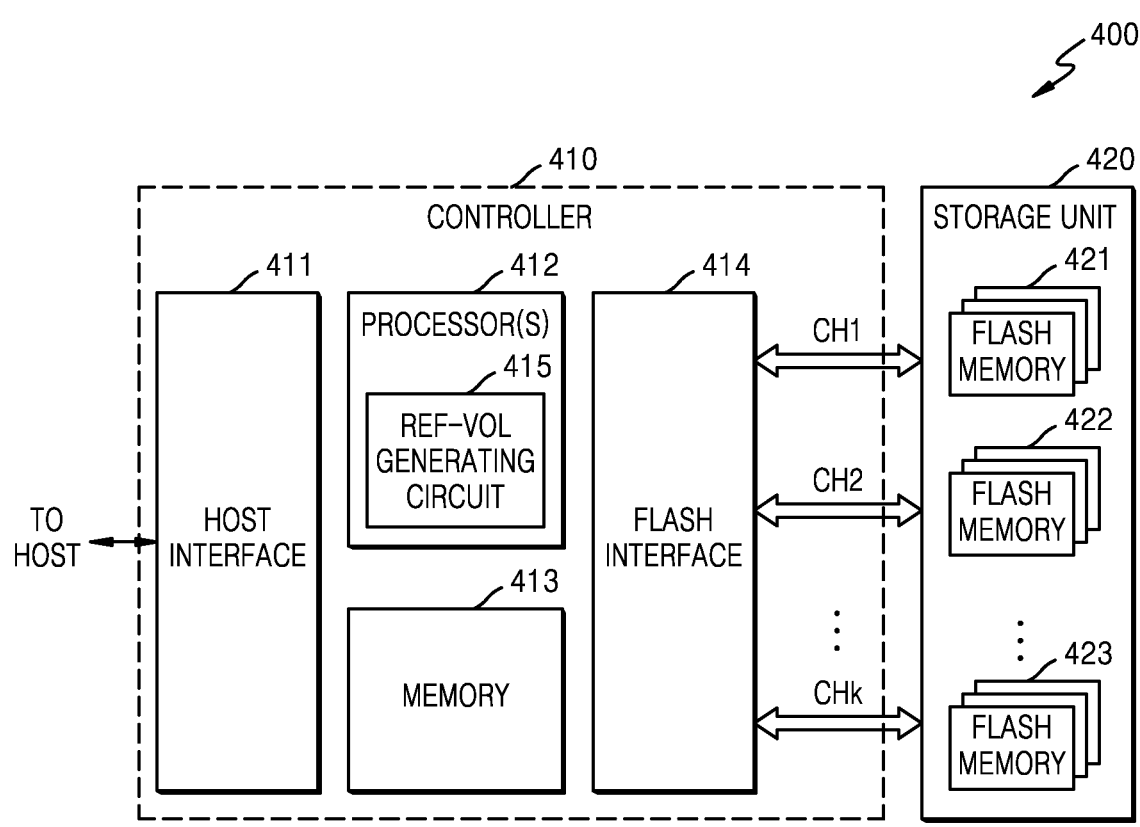
FIG. 13 is a block diagram illustrating a storage device including an embodiment of a reference voltage generating circuit.

FIG. 13 is a block diagram illustrating a storage device 400 including an embodiment of a reference voltage generating circuit.

Referring to FIG. 13, storage device 400 may be configured as a solid state drive (SSD) which is a flash-based storage system, and may include a controller 410 and a storage unit 420. Storage unit 420 may be configured with a non-volatile memory such as flash memory.

Controller 410 may include a host interface 411, a processor 412, a memory 413, and a flash interface 414. Processor 412 may include a reference voltage generating circuit 415. Reference voltage generating circuit 415 may be implemented substantially similar to reference voltage generating circuit 10 or 10*a* illustrated in FIG. 2 or 8. According to an embodiment, reference voltage generating circuit 415 may not be included in processor 412 and may be included in host interface 411, memory 413, or flash interface 414.

One or more channels (for example, k (where k is a positive integer) number of channels CH1 to CHk) may be provided between storage unit 420 and controller 410. The channels CH1 to CHk may be electrically connected to a plurality of flash memories 421 to 423. According to an embodiment, one of the channels CH1 to CHk may be connected to the same kinds of memories, and the other channels may be connected to different kinds of memories or the same kind of memories.

Host interface 411 may interface data exchange between a host and storage device 400 connected to each other through a high speed bus. Examples of a bus format of host interface 411 may include universal serial bus (USB), small computer system interface (SCSI), peripheral component interconnection express (PCI-E), advanced technology attachment (ATA), parallel-ATA (PATA), serial-ATA (SATA), and serial attached SCSI (SAS). Host interface 411 may receive a control command or data from the host. Also, host interface 411 may transfer the control command or the data, output from the host, to processor 412 through an internal bus.

Processor 412 may control an overall operation of storage device 400. Processor 412 may control data exchange between the host and host interface 411. Processor 412 may overall control storage device 400 to allow storage device 400 to perform an operation based on the control command output from the host. Processor 412 may receive the control command or the data through the internal bus from the host. Processor 412 may control storage device 400 to store data corresponding to the control command in memory 413 or flash memories 421 to 423.

Processor 412 may control an operation of storage device 400 by using a reference voltage which is generated by reference voltage generating circuit 415 and is constant regardless of a temperature change. In detail, reference voltage generating circuit 415 may include a BJT, and when a current characteristic of the BJT is changed due to the changing of a process performed on the BJT, reference voltage generating circuit 415 may adjust a first resistance value of a first variable resistor adaptively based on a changed current characteristic of the BJT. Accordingly, despite the changing of the process performed on the BJT, reference voltage generating circuit 415 may generate the reference voltage which is constant.

Memory 413 may be provided as a temporary storage space of processor 412. Memory 413 may include a non-volatile memory (for example, boot read-only memory (ROM)) which stores program code for controlling an operation of processor 412, and may also include a volatile memory (for example, DRAM or static random access memory (SRAM)) which stores data exchanged between the host and processor 412. Here, the DRAM may be used as a cache memory or a write buffer memory.

As described above, an emitter current of a BJT included in an integrated circuit may be adjusted or "corrected" to an optimal current region despite a variation in a process of forming the BJT, thereby enhancing a precision of a temperature sensor or a reference voltage generating circuit including the BJT. In detail, when the process variation of the BJT included in the integrated circuit occurs, a first resistance value of a first variable resistor included in the integrated circuit may vary, and thus, the emitter current of the BJT may be adjusted or "corrected" to the optimal current region. Also, a second resistance value of a second variable resistor included in the integrated circuit may be adjusted based on the variation of the first resistance value of the first variable resistor, thereby maintaining a temperature dependency of the reference voltage. Furthermore, a size ratio of PMOS transistors of a current source included in the integrated circuit may be adjusted, thereby maintaining a size ratio for the current.

While the inventive concept has been particularly shown and described with reference to embodiments thereof, it will be understood that various changes in form and details may be made therein without departing from the spirit and scope of the following claims. In this description and the claims which follow, when two or more currents, two or more voltages, two or more resistances, or two or more other values are said to be "substantially" the same or "substantially equal" to each other it means that the two or more currents, two or more voltages, two or more resistances, or two or more other values are within 10% of each other.

What is claimed is:

1. A reference voltage generating circuit, comprising:
an operational amplifier having a first input terminal connected to a first node, and having a second input terminal connected to a second node;
a first transistor connected between a ground terminal and the first node, wherein a first current flows in the first transistor;
a second transistor connected to the ground terminal;
a first variable resistor connected between the second transistor and the second node, the first variable resistor having a first resistance value that is adjustable; and
a current source circuit configured to provide a first reference current to a third node based on an output voltage of the operational amplifier,
wherein the third node is connected to the first node and the third node is configured to output a reference voltage based on a voltage of the first node and a voltage across the first variable resistor,
wherein the current source circuit is further configured to provide a second reference current to a fourth node based on the output voltage of the operational amplifier, and
wherein the fourth node is connected to the second node, and the fourth node and the third node are different respective nodes that are not directly connected to each other.

2. The reference voltage generating circuit of claim 1, wherein the first transistor comprises a first bipolar junction transistor (BJT), and the second transistor comprises a second BJT.

3. The reference voltage generating circuit of claim 2, wherein the first current of the first transistor is an emitter current of the first BJT.

4. The reference voltage generating circuit of claim 2, wherein
the first BJT has a base and a collector connected to the ground terminal, and an emitter connected to the first node, and
the second BJT has a base and a collector connected to the ground terminal, and an emitter connected to the first variable resistor.

5. The reference voltage generating circuit of claim 2, wherein
the first BJT has a base and a collector connected to the first node, and an emitter connected to the ground terminal, and
the second BJT has a base and a collector connected to the first variable resistor, and an emitter connected to the ground terminal.

6. The reference voltage generating circuit of claim 1, wherein the first variable resistor comprises:
a first resistor connected between the second transistor and the second node; and
a second resistor and a switch serially connected to each other, and connected to the first resistor in parallel, and
wherein an on state of the switch is controllable to adjust the first resistance value of the first variable resistor.

7. The reference voltage generating circuit of claim 1, wherein the first variable resistor comprises:
a first resistor connected to the second transistor;
a second resistor connected between the first resistor and the second node;
a first switch connected in parallel across the first resistor; and
a second switch connected in parallel across the second resistor, and
wherein on states of the first switch and the second switch are controllable to adjust the first resistance value of the first variable resistor.

8. The reference voltage generating circuit of claim 1, wherein the first variable resistor comprises:
a first resistor connected to the second transistor;
a second resistor connected between the first resistor and the second node;
a third resistor and a first switch serially connected to each other, and connected in parallel across the first resistor; and
a fourth resistor and a second switch serially connected to each other, and connected to the second resistor in parallel, and
wherein on states of the first switch and the second switch are controllable to adjust the first resistance value of the first variable resistor.

9. The reference voltage generating circuit of claim 1, wherein the reference voltage generating circuit further comprises a second variable resistor connected between the first node and the third node, the second variable resistor having a second resistance value that varies proportional to an adjusted value of the first resistance value of the first variable resistor to maintain a constant ratio of the second resistance value to the first resistance value.

10. The reference voltage generating circuit of claim 9, further comprising a third variable resistor connected between the second node and the fourth node, the third variable resistor having a third resistance value proportional to the first resistance value of the first variable resistor.

11. The reference voltage generating circuit of claim 9, wherein the first reference current is substantially equal to the second reference current.

12. A temperature sensor, comprising:
a reference voltage generating circuit configured to generate first and second reference voltages which are constant regardless of temperature;
a first voltage generating circuit configured to generate a first voltage proportional to the temperature, based on the second reference voltage; and
an analog-to-digital converter (ADC) configured to produce a digital temperature signal, based on the first reference voltage and the first voltage,
wherein the reference voltage generating circuit comprises
an operational amplifier having a first input terminal connected to a first node, and having a second input terminal connected to a second node,
a first transistor connected between a ground terminal and the first node, wherein a first current flows in the first transistor,
a second transistor connected to the ground terminal,
a first variable resistor connected between the second transistor and the second node, the first variable resistor having a first resistance value that is adjustable, and
a current source circuit configured to provide a first reference current to a third node based on an output voltage of the operational amplifier,
wherein the third node is connected to the first node and the third node is configured to output the first and second reference voltages based on a first node voltage of the first node and a voltage across the first variable resistor.

13. The temperature sensor of claim 12, wherein
the first transistor comprises a first bipolar junction transistor (BJT),
the second transistor comprises a second BJT, and
the first current of the first transistor is an emitter current of the first BJT.

14. The temperature sensor of claim 13, wherein the current source circuit is further configured to provide a second reference current to a fourth node based on the output voltage of the operational amplifier, wherein the fourth node is connected to the second node,
the reference voltage generating circuit further comprising a second variable resistor connected between the first node and the third node, the second variable resistor having a second resistance value proportional to the first resistance value of the first variable resistor.

15. An integrated circuit, comprising:
a reference voltage generating circuit configured to provide a reference voltage; and
an internal circuit configured to operate based on the reference voltage,
wherein the reference voltage generating circuit comprises
an operational amplifier comprising a first input terminal connected to a first node and a second input terminal connected to a second node,
a first transistor connected between a ground terminal and the first node, wherein a first current flows in the first transistor,
a second transistor connected to the ground terminal,
a first variable resistor connected between the second transistor and the second node, the first variable resistor having a first resistance value that is adjustable, and
a current source circuit configured to provide a first reference current to a third node based on an output voltage of the operational amplifier,
wherein the third node is connected to the first node and the third node is configured to output the reference voltage based on a voltage of the first node and a voltage across the first variable resistor,
wherein the current source circuit is further configured to provide a second reference current to a fourth node based on the output voltage of the operational amplifier, and
wherein the fourth node is connected to the second node, and the fourth node and the third node are different respective nodes that are not directly connected to each other.

16. The integrated circuit of claim 15, wherein
the first transistor comprises a first bipolar junction transistor (BJT),
the second transistor comprises a second BJT, and
the first current of the first transistor is an emitter current of the first BJT.

* * * * *